United States Patent [19]

Peppel

[11] Patent Number: 4,920,447
[45] Date of Patent: Apr. 24, 1990

[54] METHOD FOR PROTECTING THE GATE UNIT FOR A GTO THYRISTOR

[75] Inventor: Michael Peppel, Weinheim, Fed. Rep. of Germany

[73] Assignee: BBC Brown Boveri AG, Baden, Switzerland

[21] Appl. No.: 281,516

[22] Filed: Dec. 8, 1988

[30] Foreign Application Priority Data

Dec. 9, 1987 [DE] Fed. Rep. of Germany ....... 3741713

[51] Int. Cl.$^5$ .......................... H02H 7/12; H02H 3/08
[52] U.S. Cl. ...................... 361/93; 361/101; 361/87; 363/50; 363/57
[58] Field of Search .............. 361/93, 94, 95, 96, 361/97, 98, 100, 101, 79, 86, 88, 91, 87; 307/571, 633; 363/54, 57, 58, 50

[56] References Cited

U.S. PATENT DOCUMENTS

| | | | |
|---|---|---|---|
| 4,363,064 | 12/1982 | Billings et al. | 363/50 |
| 4,597,038 | 6/1986 | Stacey | 363/56 |
| 4,641,231 | 2/1987 | Walker et al. | 363/58 |
| 4,674,023 | 6/1987 | Peppel et al. | 363/57 |
| 4,682,278 | 7/1987 | Marquardt et al. | 363/58 |
| 4,755,925 | 10/1988 | Lezan et al. | 307/633 X |

FOREIGN PATENT DOCUMENTS

3434607 3/1986 Fed. Rep. of Germany .

OTHER PUBLICATIONS

A GTO DC Circuit Breaker Controlled by a Single--Chip Microcomputer; 1985 IEEE, vol IE-32, No 3, pp. 204-209.

Primary Examiner—William M. Shoop, Jr.
Assistant Examiner—Howard L. Williams
Attorney, Agent, or Firm—Herbert L. Lerner; Laurence A. Greenberg

[57] ABSTRACT

A method for protecting the gate unit for a GTO thyristor includes predetermining a characteristic curve as a time function adapted both to the maximum load capacity possible for a brief time and to the long-term load capacity of a controllable electronic switch of the gate unit connected to the GTO thyristor. The voltage dropping at the electronic switch is detected and compared with the predetermined characteristic curve. The electronic switch is blocked as soon as the detected switching voltage exceeds the predetermined characteristic curve. An erase pulse switches off the GTO thyristor with the controllable electronic switch.

6 Claims, 2 Drawing Sheets

METHOD FOR PROTECTING THE GATE UNIT FOR A GTO THYRISTOR

SPECIFICATION

The invention relates to a method for protecting the gate unit for a GTO thyristor, in which a controllable electronic switch serves to switch off the GTO thyristor by means of an erase pulse, wherein the voltage dropping at the controllable electronic switch is detected and compared with a predetermined characteristic curve.

It is known, for instance, from IEEE Transactions on Industrial Electronics, Vol. IE-32, No. 3, August 1985, page 204, that the triggering of a GTO thyristor requires a special trigger unit which is the gate unit, that supplies currents to the gate terminal of the GTO thyristor which are required for switching the GTO thyristor on and off. The shutoff portion of a gate unit includes a high-power voltage source, which is connected to the output terminals of the gate unit through a controllable electronic switch in the form of a plurality of parallel field effect transistors, in order to generate negative erase pulses. If there is a short circuit at the output of the gate unit, or if the GTO thyristor connected thereto is defective, then the on-state overload currents that then arise can destroy the field effect transistors of the electronic switch.

If a short circuit of the terminals of the gate unit occurs, this gives rise to a high on-state overload current that is above the operating maximum and quickly destroys the field effect transistors. If the GTO thyristor is defective, this generally only gives rise to fault currents which are at the level of the regular GTO erase pulses, or below. However, since these fault currents flow for substantially longer than the maximum duration of the erase pulses, the field effect transistors are threatened in this case as well.

It is accordingly an object of the invention to provide a method for protecting the gate unit for a GTO thyristor, which overcomes the hereinafore-mentioned disadvantages of the heretofore-known methods of this general type and which reliably protects the controllable electronic switch used to switch off the GTO thyristor both upon the occurrence of a terminal short circuit and upon a fault of the GTO thyristor.

With the foregoing and other objects in view there is provided, in accordance with the invention, a method for protecting the gate unit for a GTO thyristor, which comprises predetermining a characteristic curve as a time function adapted both to the maximum load capacity possible for a brief time and to the long-term load capacity of a controllable electronic switch of the gate unit connected to the GTO thyristor, detecting and comparing the voltage dropping at the electronic switch with the predetermined characteristic curve, blocking the electronic switch as soon as the detected switching voltage exceeds the predetermined characteristic curve, and switching off the GTO thyristor with the controllable electronic switch by means of an erase pulse.

The advantages attainable with the invention are in particular that the method requires little effort or expense. Both different types of fault (terminal short circuit and GTO thyristor defects) are reliably controlled. In so doing, it is possible to fully exploit both the briefly possible maximum load capacity and the long-term load capacity of the controllable electronic switch.

In accordance with another mode of the invention, there is provided a method which comprises dimensioning a threshold value for the characteristic curve to be at a constant value never being attained by a regular erase pulse during a first time interval immediately following switching-on of the electronic switch, but being exceeded upon the occurrence of a terminal short circuit at the output of the gate unit.

In accordance with a further mode of the invention, there is provided a method which comprises dimensioning the threshold value of the characteristic curve to be decreased from the constant value to a lower value during a second time interval following the first time interval, and dimensioning the lower value for the allowable long-term load of the electronic switch.

In accordance with an added mode of the invention, there is provided a method which comprises exponentially lowering the threshold value of the characteristic curve in the second time interval.

In accordance with a concomitant mode of the invention, there is provide a method which comprises preventing detection of the voltage dropping at the switch when the electronic switch is blocked.

Other features which are considered as characteristic for the invention are set forth in the appended claims.

Although the invention is illustrated and described herein as embodied in a method for protecting the gate unit for a GTO thyristor, it is nevertheless not intended to be limited to the detailed shown, since various modifications may be made therein without departing from the spirit of the invention and within the scope and range of equivalents of the claims.

The method of operation of the invention, however, together with additional objects and advantages thereof will be best understood from the following description of specific embodiments when read in connection with the accompanying drawings.

Figure 1:
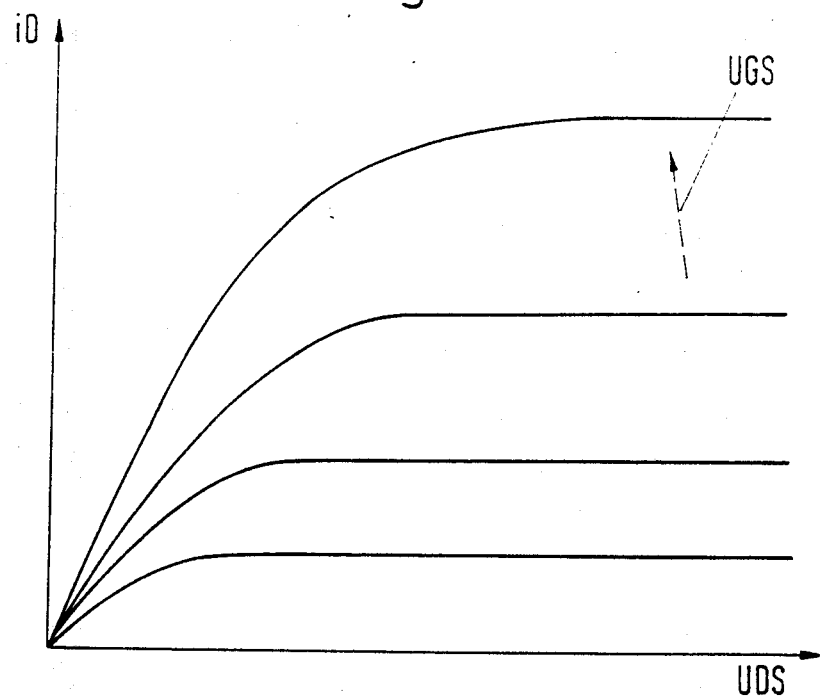
FIG. 1 is an output characteristics graph of a power field effect transistor.

Referring now to the figures of the drawing in detail and first, particularly, to FIG. 1 thereof, there is seen an output characteristics graph of a power field effect transistor (MOSFET) (UDS up to approximately 10 V, iD up to approximately 200 A, UGS to approximately 17 V, and single pulses having a pulse duration of approximately 75 μs). The dependency of the drain current iD through the field effect transistor on the drain-to-source voltage UDS at the field effect transistor is shown in the graph with the gate-to-source voltage UGS (control voltage) at the field effect transistor serving as a parameter. The characteristics graph shows that even power MOSFETs, with maximum level control, still exhibit the typical behavior of conventional field effect transistors. With a relatively low drain-to-source voltage UDS, the field effect transistor behaves like an ohmic resistor, with a voltage drop proportional to current. On the other hand, at a relatively high drain-to-source voltage ("cut-off range"), the field effect transistor behaves like a current source. In other words, the drain current iD is independent of the drain-to-source voltage UDS. A wide transition zone exists between the two modes of behaviour.

The behavior visible from the characteristics graph has some important aspects for the protection method described below. First, it can be seen that if the drain-to-source voltage UDS of the field effect transistor is known, a conclusion can be drawn as to the drain current iD that is flowing, if the control voltage UDS is known. It can also be seen that the drain current iD, beyond a specific UDS threshold, does not exceed a maximum value defined by the field effect transistor itself. Finally, experience shows that the field effect transistor withstands operation at this maximum current without damage for several microseconds (pulse duration).

The protection method purposefully exploits these previously known properties of the field effect transistor. The drain-to-source voltage UDS at the transistor is used as an indicator for an overload of the field effect transistor caused by an overload on-state current. This drain-to-source voltage UDS is compared with a predetermined threshold value of a characteristic curve KL seen in FIG. 3. If UDS exceeds the threshold value of the characteristic curve, then the field effect transistor is compulsorily blocked, and the on-state overload current (fault current) is interrupted. The characteristic curve is a time function adapted to the current course of the field effect transistor to be expected during unimpeded operation, taking into consideration the possible load capacity at a given time.

Figure 2:
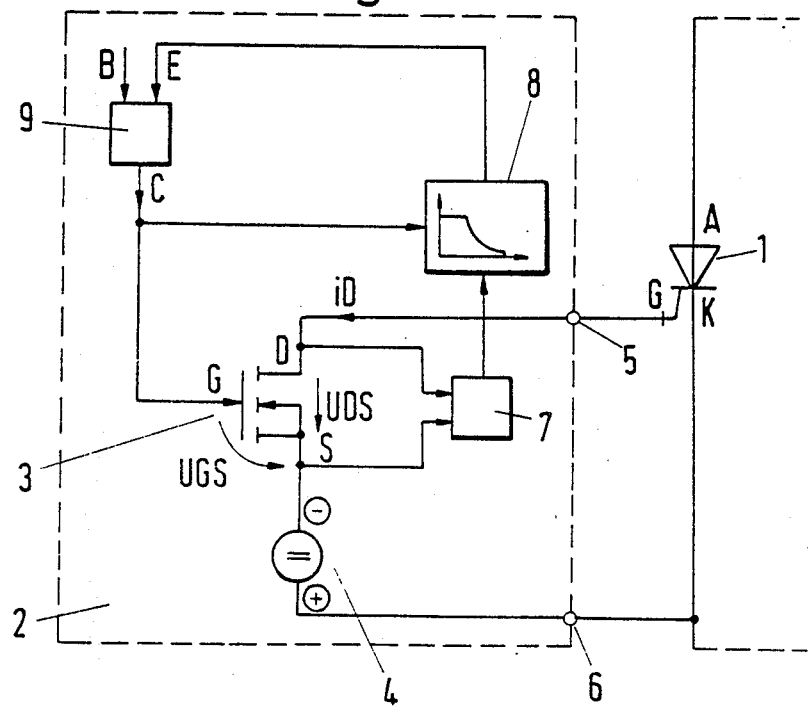
FIG. 2 is a schematic and block circuit diagram of a basic circuit for protecting a field effect transistor.

In FIG. 2 shows a basic circuit for protecting a field effect transistor, in order to provide further explanation of the protection method. A GTO thyristor 1 can be seen having an anode A, cathode K and gate G. The triggering (switching on and off) of the GTO thyristor 1 is effected by a gate unit (trigger unit) 2. This gate unit 2 has a field effect transistor 3 for switching off the GTO thyristor 1, with a drain D, source S and gate G. Typically, a plurality of power MOSFETs are connected in parallel and controlled. However, in the ensuing discussion only one field effect transistor will be considered.

The source S is connected to the negative pole of a direct or constant voltage source 4. The drain D is connected through an output terminal 5 of the gate unit 2 to the gate G of the GTO thyristor. The current flowing in the drain D is indicated by reference numeral iD. The positive pole of the direct or constant voltage source 4 is connected through a further output terminal 6 of the gate unit 2 to the cathode K of the GTO thyristor 1. A voltage detecting device 7 detects the voltage UDS present between the drain D and source S and reports this to an evaluation device 8. The gate G is subjected to control signals C from a control unit 9. These control signals C are likewise supplied to the evaluation unit 8. Commands B (blocking command-/conducting command) and optionally blocking commands E of the evaluation unit 8 are present on the input side of the control device 9.

Figure 3:
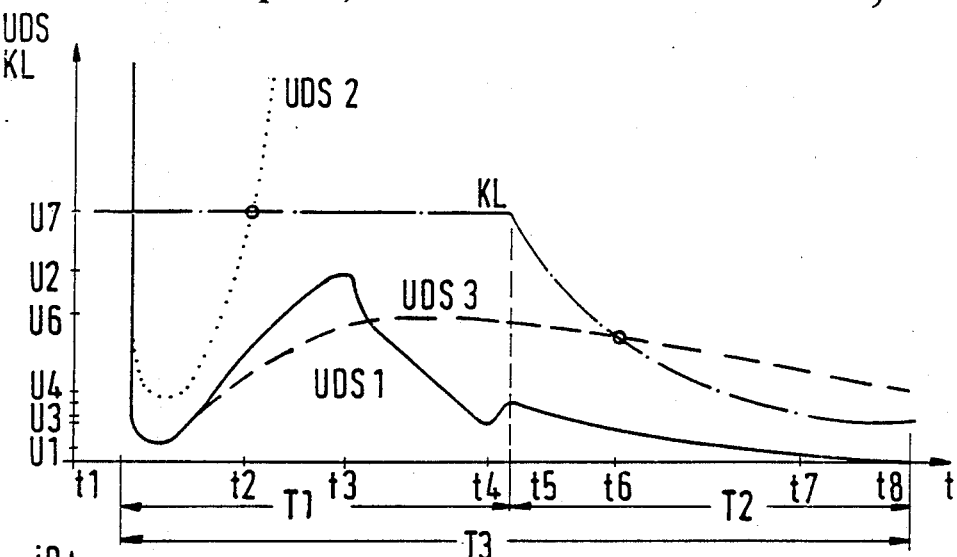
FIG. 3 is a graph of curves for current and voltage in a field effect transistor, and a characteristic curve of the evaluation device.

In the presence of a control signal C, the evaluation device compares the detected voltage UDS with a predetermined characteristic curve KL seen in FIG. 3 (comparison voltage, time function). If the drain-to-source voltage exceeds the threshold value of the predetermined characteristics curve, then the evaluation device 8 sends a blocking command E to the control device 9, in order to interrupt the flow of current through the field effect transistor 3. In this way, the field effect transistor 3 is protected from destruction caused by an on-state overload current (fault current). If the drain-to-source voltage which is detected remains below the threshold value of the characteristic curve over the entire period of time monitored by the evaluation device, then no reaction the part of the evaluation device 8 takes place. If the field effect transistor 3 is blocked (that is, if no control signal C is present), then the evaluation device 8 is switched off.

In order to further explain the evaluation device 8, the current and voltage curves, courses or paths for a field effect transistor and the characteristic curve of the evaluation device are shown in FIG. 3. Referring to the figure in detail, it is seen that the upper diagram of FIG. 3 shows the paths or courses over time of the drain-to-source voltages UDS1 (solid line), UDS2 (dotted line), UDS3 (dashed line) and the characteristic curve KL of the evaluation device 8 (dot-dash line). In the lower diagram of FIG. 3, the courses over time of the drain currents iD1 (solid line), iD2 (dotted line) and iD3 (dashed line) are shown.

The drain-to-source voltage UDS1 and the drain current iD1 correspond to unimpeded operation of the field effect transistor 3. At a time t1, the actuation of the field effect transistor 3 is initiated by a control signal C (see FIG. 2). The drain-to-source voltage UDS1 drops shortly after t1 to a first minimum value U1, then at time t3 is attains a first peak value U2, subsequently drops to a second minimum value U3 at time t4, then rises to a second peak value U4 at time t5, and finally drops exponentially to the value 0 at time t7. By the time t3, the drain current iD1 rises to a first peak value i1, at time t4 drops to a first minimum value i2, at time t5 rises to a second peak value i3 ("tail current"), and finally drops exponentially to the value 0 at time t7.

The drain-to-source voltage UDS2 and the drain current iD2 correspond to operation of the field effect transistor 3 upon a terminal short circuit between the two output terminals 5, 6 of the gate unit 2. The drain-to-source voltage UDS2 drops shortly after t1, to a first minimum value U5 and then rises steeply upward. At time t2, there is an intersection between UDS2 and the threshold value of the characteristic curve KL. From time t1, the drain current iD2 rises steeply upward and at time t2 (that is, the time at which the compulsory switching off of the field effect transistor by the evaluation device 8 is initiated), attains the shutoff value i4. The maximum value of the drain current that the field effect transistor is capable of carrying briefly without destruction is indicated as iD5. It will be understood that the aforementioned shutoff value i4 of the drain current must not attain or exceed the maximum value i5.

The drain-to-source voltage UDS3 and the drain current iD3 are equivalent to operation of the field effect transistor if a GTO thyristor 1 is defective. The drain-to-source voltage UDS3 drops, as in unimpeded operation, to a minimum value U1 shortly after time t1, then rises slowly to a peak value U6 in the period of time between t3 and t4, and subsequently drops relatively slowly. The peak value U6 is slightly lower than the peak value U2 in unimpeded operation. In the period of time considered, UDS3 does not attain the value 0. At time t6, there is an intersection between UDS3 and the threshold value of the characteristic curve KL. From time t1, the drain current iD3 rises slowly to a peak value i6 in the period of time between t3 and t4, and after that drops slowly. The peak value i6 is slightly lower than the peak value i1 in unimpeded operation. In the period of time under observation, iD3 does not attain the value 0. If the courses of current and voltage during unimpeded operation and upon the occurrence of a fault in the case of a terminal short circuit and a defective GTO thyristor are taken into consideration together, it can be found that in the case of the terminal short circuit fault, a high overload current (see iD2) that is above the maximum value i5 occurs in the field effect transistor, along with a high voltage drop at the drain-to-source path of the field effect transistor (see UDS2). The field effect transistor is destroyed within a short time. In the case of defective GTO thyristor faults, only fault currents (see iD3) at the level of the regular drain current (see iD1) or below generally occur. Since these fault currents (see iD3) flow substantially longer than the maximum duration of the brief erase pulses (see iD1), however, the field effect transistor is threatened in the case of this fault as well.

The characteristic curve KL of the evaluation device 8 should be formed in such a way that the field effect transistor is reliably protected against both dangerous faults. To this end, the characteristic curve KL has a threshold value U7, in a first time interval T1, which is dimensioned in such a way that during unimpeded operation of the field effect transistor 3 (regular erase current of the GTO thyristor, no terminal short circuits, no defective GTO thyristor), this threshold value U7 is never attained by the drain-to-source voltage (UDS1), yet upon a terminal short circuit at the gate unit 2 (UDS2), the threshold is exceeded. The duration of the time interval T1 is dimensioned in such a way that the erase current of the GTO thyristor has substantially faded, even under "worst case" conditions. After T1 has elapsed, the threshold value of the characteristic curve KL is reduced during a second time interval T2 with temporal dependency down to a value U8, far enough that only the allowable long-term load of the field effect transistor is taken into account. This is possible because in this second time interval, with unimpeded operation, the field effect transistor only carries a very low drain current (iD1). The threshold value U8 of the characteristic curve in the second time interval T2 should be dimensioned in such a way that the evaluation device 8 is not activated by the normal "tail current" of the GTO thyristor (see UDS1 or iD1 in the period of time between t4 and t7) following through the field effect transistor. The duration of the time interval T2 must be so long that the drain current (see iD1) in unimpeded operation has reliably faded. According to FIG. 3, the characteristic curve KL ends at the time t8. Since the drain-to-source voltage UDS3 in the case of a defective GTO thyristor is elevated as compared to the voltage UDS1 with unimpeded operation in the time interval T2, this causes the characteristic curve KL of the evaluation unit 8 to be exceeded.

Figure 4:
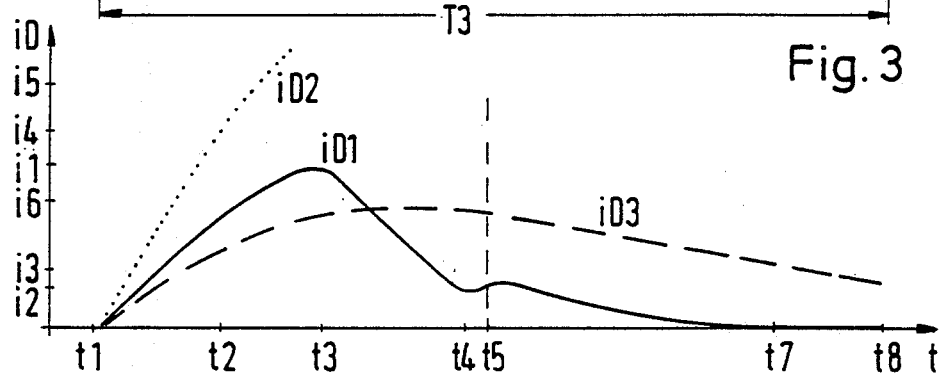
FIG. 4 is a circuit diagram of a detailed exemplary embodiment for protecting a trigger unit.
Figure 4:
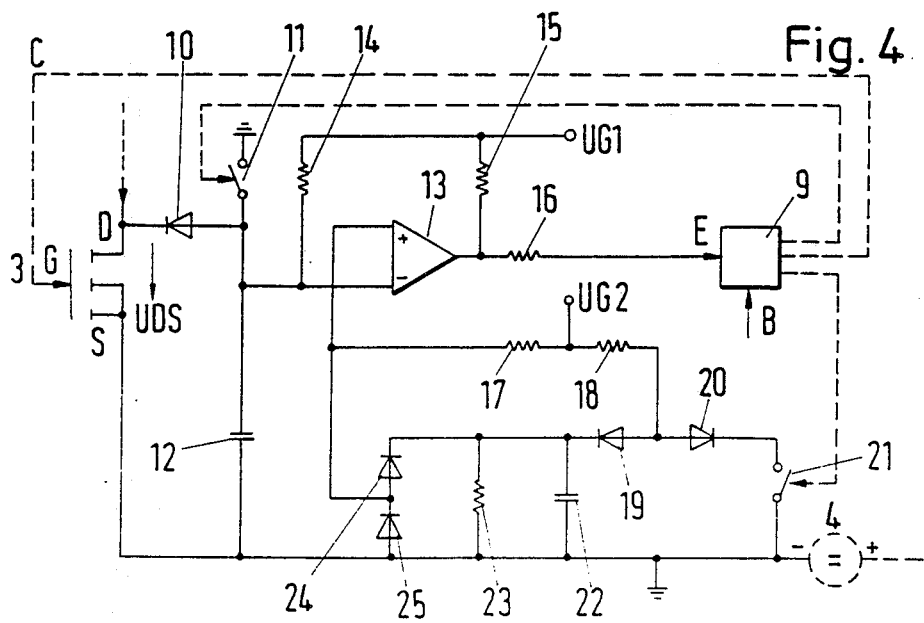

FIG. 4 shows a detailed exemplary embodiment for protecting a trigger unit 8. In detail, it can be seen that the cathode of a diode 10 is connected to the drain D of the field effect transistor 3. The anode of the diode 10 can be connected to ground through a controllable electronic switch 11. The switch 11 is triggered by the control device 9. At the same time, the anode of the diode 10 is connected through a capacitor 12 to the source of the FET 3, to the negative input of a comparator 13, and through a resistor 14 to a positive direct voltage UG1. A resistor 15 is connected between the direct voltage UG1 and the output of the comparator 13. A further resistor 16 is located between the output of the comparator 13 and the control device 9 for the FET.

The positive input of the comparator 13 is connected through a resistor 17 to a positive direct voltage UG2 and through a resistor 18 connected in series with the resistor 17 to the common connecting point of the anodes of two diodes 19, 20. The cathode of the diode 20 can be connected to ground through a controllable electronic switch 21. The switch 21 is triggered by the control device 9. The cathode of the diode 19 is connected through a capacitor 22 as well as through a parallel resistor 23 to ground and is connected to the cathode of a Zener diode 24. The anode of the Zener diode 24 is connected to a point interconnecting the resistor 17 and the positive comparator input, and is connected to ground through the cathode-to-anode path of a further Zener diode 25. The negative pole of the direct or constant voltage source 4 is likewise connected to ground.

In order to explain the functioning of the circuit of FIG. 4, it is assumed that the drain-to-source voltage UDS at the field effect transistor 3 is supplied to the negative input of the comparator 13 through the "terminal circuit" formed of the diode 10 and the resistor 14. In order to assure that the relatively high voltage UDS occurring in the off state of the field effect transistor 3 is not incorrectly interpreted by the comparator 13 as an extremely high overload on-state current, the electronic switch 11 connects the negative comparator input to ground, as soon as the field effect transistor 3 is in the blocking state. In other words, the electronic switch 11 is closed whenever the FET is blocked and opened whenever the FET is conducting. This is equivalent to the switching off of the evaluation device 8 as a function of the control signals C mentioned in connection with FIG. 2.

The comparison voltage (equal to the characteristic curve KL) present at the positive input of the comparator 13 is "driven" in accordance with a time function, so that on one hand the high gate current peaks of the GTO thyristor 1 (see iD1, i1, UDS1, U2 in FIG. 3) will not trip the protection, yet on the other hand even relatively low but long-persisting fault currents (see iD3, UDS3 in FIG. 3) do cause tripping. The comparison voltage transducer includes the resistors 17, 18, 23, the capacitor 22, the switch 21, the diodes 19, 20, the Zener diodes 24, 25 and the direct voltage UG2.

Immediately after the field effect transistor 3 is switched on, the threshold value of the characteristic curve KL (comparison level) is initially U7 (for example, U7 seen in FIG. 3 may equal 3 V). At this threshold value, a typically used power MOSFET can carry a drain current of 100 A, for example. With a parallel circuit of a plurality of power MOSFETs, this is sufficient to generate a GTO shutoff pulse. After a time interval T1 of 40 μs, for example, the threshold value of the characteristic curve KL is "driven downward" exponentially to U8 (for example, U8 may equal 1.5 Volts). At the threshold value U8, long-term operation of the power MOSFETs is allowable. The comparison voltage transducer functions as follows: whenever the field effect transistor 3 is blocked (GTO thyristor 1 is conducting), the switch 21 is opened; when the field effect transistor is conducting, the switch 21 is closed. With a blocking FET 3 and an opened switch 21, a current flows from UG2 to ground through the resistor 18, the diode 19, and the Zener diodes 24 and 25 which are operated in the blocking direction. The comparison voltage (i.e., characteristic curve KL) present at the positive input of the comparator 13 has its "starting value" U7, which is determined by the Zener diode 25. The capacitor 22 is charged to a voltage determined by the Zener diodes 24, 25. At time t1, the field effect transistor 3 is switched on. At the same time, the switch 21 is closed. As a result, the anode of the diode 19 is connected through the diode 20 to ground (optionally, the circuit may also be formed in such a way that by means of the switch 21 itself, the field effect transistor 3 is switched on and at the same time the anode of the diode 19 is connected to ground). As a result, the diode 19 and the Zener diode 24 block immediately. The comparison voltage (i.e., characteristic curve KL) present at the positive input of the comparator 13 is "held" in the time interval t1 through the resistor 17 and the Zener diode 25 and continues to be U7. The capacitor 22 discharges through the resistor 23, since it is completely decoupled from the remaining comparison voltage transducer. Beyond a certain value of the capacitor voltage an capacitor 22, the Zener diode 24 becomes conductive in the flow direction. This is equivalent to time t5 of FIG. 3. From time t5 on, the comparison voltage (i.e., characteristic curve KL) present at the positive input of the comparator 13 follows the capacitor voltage an22 through the conducting Zener diode 24. As before, the capacitor 22 discharged through the resistor 23. This is equivalent to the time interval T2 of FIG. 3.

In this interval, the comparison voltage of the comparator 13 decreases exponentially in accordance with the standard defined by the resultant RC time constants of the elements 17, 22 and 23, until it has attained its final value U8. The value U8 is obtained from the vision of the voltage UG2 by the resistors 17 and 23, taking into account the flow voltage of the diode 24.

The foregoing is a description corresponding in substance to German Application P 37 41 713.4, dated December 9, 1987, the International priority of which is being claimed for the instant application, and which is hereby made part of this application. Any material discrepancies between the foregoing specification and the aforementioned corresponding German application are to be resolved in favor of the latter.

I claim:

1. Method for protecting the gate unit for a GTO thyristor, in which a controllable electronic switch operates to turn off the GTO thyristor by means of an erase pulse, comprising the step of:

detecting a voltage drop across said controllable electronic switch;
  comparing in an evaluation device the voltage drop with a given threshold curve, wherein said threshold curve is defined on the basis of the maximal short term load carrying capacity of said electronic switch, during which term the threshold curve has a constant value in a first time interval immediately after switching on said electronic switch, which is never reached during normal operation, but is exceeded in case of a short-circuit at the output of said electronic switch; and wherein said threshold curve is further defined on the basis of the long term load-carrying capacity of said electronic switch, during which term the value of the threshold curve is reduced to a lower value than said constant value, during a second time interval following said first time interval; and
  blocking said electronic switch at the moment the voltage drop across said electronic switch exceeds a value of said threshold curve.

2. Method according to claim 1, wherein said threshold curve has an exponentially decreasing value during said second time interval.

3. Method according to claim 1, which comprises preventing detection of the voltage drop across said electronic switch when said electronic switch is blocked.

4. Method for protecting the gate unit for a GTO thyristor, which comprises predetermining a characteristic curve as a time function adapted both to the maximum load capacity possible for a brief time and to the long-term load capacity of a controllable electronic switch of the gate unit connected to the GTO thyristor, detecting and comparing the voltage dropping at the electronic switch with the predetermined characteristic curve, blocking the electronic switch as soon as the detected switching voltage exceeds the predetermined characteristic curve, dimensioning a threshold value for the characteristic curve to be at a constant value never being attained by a regular erase pulse during a first time interval immediately following switching-on of the electronic switch, but being executed upon the occurrence of a terminal short circuit at the output of the gate unit.

5. Method according to claim 4, which comprises dimensioning the threshold value of the characteristic curve to be decreased from the constant value to a lower value during a second time interval following the first time interval, and dimensioning the lower value for the allowable long-term load of the electronic switch.

6. Method according to claim 5, which comprises exponentially lowering the threshold value of the characteristic curve in the second time interval.

* * * * *